(12) United States Patent
Livolsi

(10) Patent No.: US 6,404,257 B1
(45) Date of Patent: Jun. 11, 2002

(54) VARIABLE DELAY ELEMENT FOR JITTER CONTROL IN HIGH SPEED DATA LINKS

(75) Inventor: Robert R. Livolsi, Shokan, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/584,028

(22) Filed: May 30, 2000

(51) Int. Cl.7 .............................................. H03H 11/26
(52) U.S. Cl. ...................... 327/276; 327/317
(58) Field of Search ................................. 327/261–263, 327/276, 277, 291, 317, 378, 379, 141, 142, 161, 159, 107; 326/104

(56) References Cited

U.S. PATENT DOCUMENTS

| 4,818,950 A | | 4/1989 | Ranger ...................... 328/155 |
| 5,544,203 A | * | 8/1996 | Casasanta et al. ........... 375/376 |
| 5,939,929 A | | 8/1999 | Tsinker ....................... 327/391 |
| 5,955,906 A | * | 9/1999 | Yamaguchi .................. 327/259 |
| 6,016,082 A | | 1/2000 | Cruz et al. ............. 331/117 FE |
| 6,150,859 A | * | 11/2000 | Park ............................. 327/158 |
| 6,222,406 B1 | * | 4/2001 | Noda et al. .................. 327/269 |

* cited by examiner

Primary Examiner—My-Trang Nu Ton
(74) Attorney, Agent, or Firm—Lynn L. Augspurger

(57) ABSTRACT

A circuit and method for decreasing the amount of jitter present at the receiver input of high speed data links which uses a driver circuit for input from a high speed data link which comprises a logic circuit having a first section (1) which provides data latches, a second section (2) which provides a circuit generates a pre-destorted output and for compensating for level dependent jitter having an OR function element and a NOR function element each of which is coupled to two inputs and to a variable delay element as an input which provides a bi-modal delay for pulse width pre-distortion, a third section (3) which provides a muxing circuit, and a forth section (4) for clock distribution in the driver circuit. A fifth section is used for logic testing the driver circuit.

4 Claims, 3 Drawing Sheets

VARIABLE DELAY ELEMENT FOR JITTER CONTROL IN HIGH SPEED DATA LINKS

RELATED APPLICATIONS

This application is related to the application Ser. No. 09/584,027, filed May 30, 2000, concurrently herewith of Robert R. Livolsi entitled "Multi Level Jitter precompensation logic circuit for high speed data links".

FIELD OF THE INVENTION

This invention relates to driver circuits which are particularly used as driver elements in a High Speed Data link to provide control of jitter in an output signal.

These co-pending applications and the present application are owned by one and the same assignee, International Business Machines Corporation of Armonk, N.Y.

The descriptions set forth in these co-pending applications are hereby incorporated into the present application by this reference.

Trademarks: S/390 and IBM are registered trademarks of International Business Machines Corporation, Armonk, N.Y., U.S.A. Other names may be registered trademarks or product names of International Business Machines Corporation or other companies.

Background: Signal drivers for high speed data links are known, as illustrated by U.S. Pat. No. 5,939,929, granted Aug. 15, 1999 entitled "Low jitter low power single ended driver" which could be used for ethernet repeaters and which produced a symmetric and therefor low jitter output signal in response to an input signal. This circuit required a first and second constant current which were combined to produce an output signal which was symmetric to the input signal received by the terminal circuit. For gigahertz frequencies Sun Microsystems, Inc. engineers designed a low phase noise LC oscillator for microprocessor clock distribution as described in U.S. Pat. No. 6,016,082, granted Jan. 18, 1992, where a continuously modifiable gigahertz frequency VCO circuit generated an output signal with a frequency that was dependent on the voltage on a control voltage input line. This output signal was provided to a level shifter output circuit which converts the current signal to a single-ended voltage that is supplied to the output driver which provides the output signal to a clock distribution network.

In spite of these recent efforts, a review of the patent literature shows a failure to recognize that there is jitter which is produced by pre-emphasis or pre-distortion on a driver, and pre-emphasis has become desirable, as illustrated by the iniband standard being developed.

SUMMARY OF THE INVENTION

The driver circuit of the present invention allows for level pre-emphasis in a driver, and yet compensates for level deployed jitter proved by pre-emphasis or pre-distortion on a driver signal to reduce the amount of jitter present at the receiver input of high speed data links. In accordance with the invention, the circuit used in the method for "pre-distorting" the data in both amplitude and pulse width in order to reduce overall jitter as described in the related application "Multi-Level Jitter pre-compensation logic circuit for high speed data links" can employ the circuit of the present invention.

A multi-level method for properly ratioing pulse width amplitudes and pre-compensating for pulse width distortion is presented. The preferred embodiment of this invention employs a variable delay element for jitter control in the high speed circuits where its effectiveness have been demonstrated.

For completeness, while not developed at the request of the U.S. Government, this invention has been secretly demonstrated for use in a 2 gigabit per second links for the U.S. government. The U.S. Government is understood not to have any ownership interest in the invention.

These and other improvements are set forth in the following detailed description. For a better understanding of the invention with advantages and features, refer to the description and to the drawings.

Figure 1:
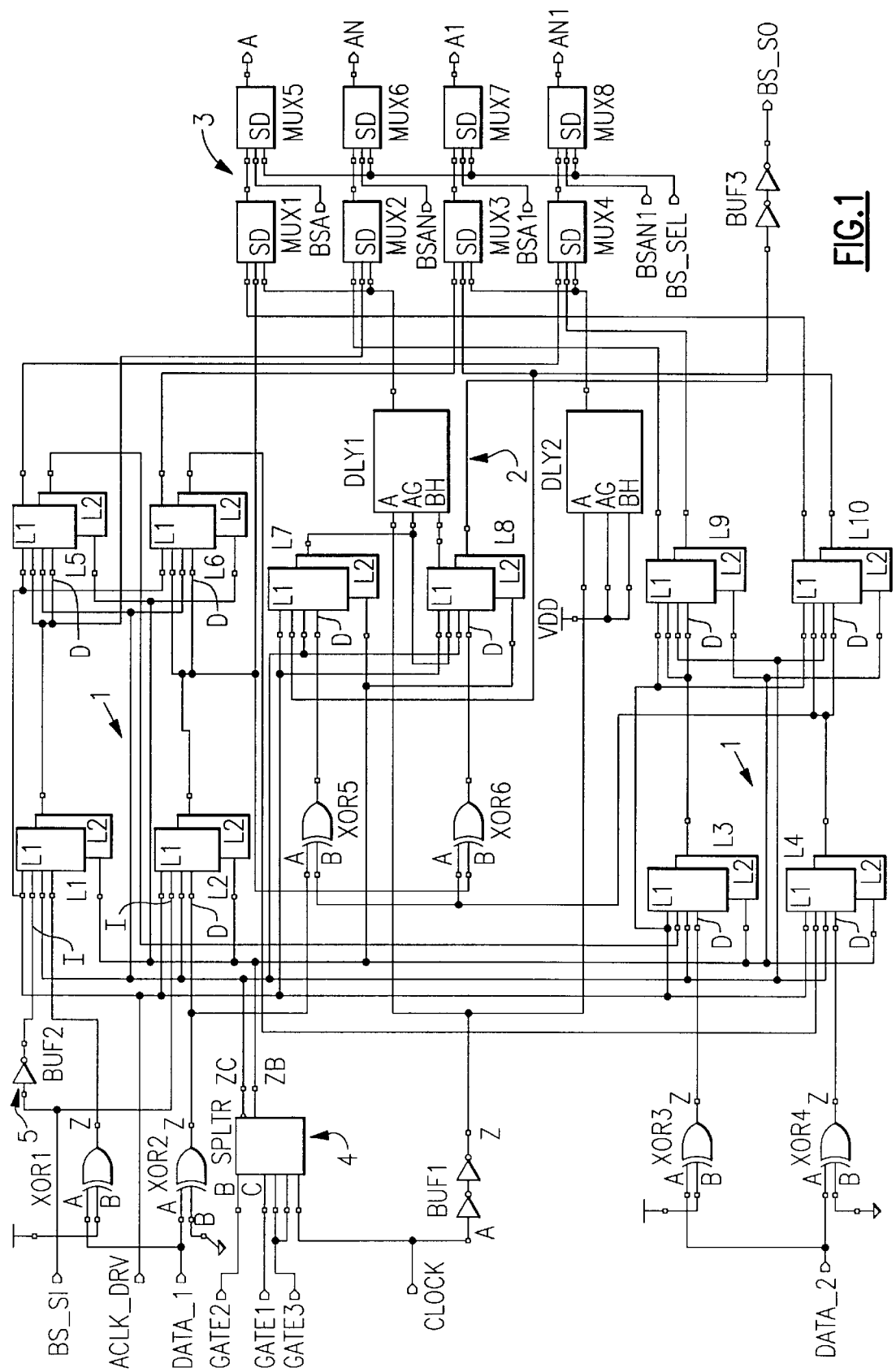
FIG. 1 illustrates the principles of the method for use in a receiver which employs the circuit of my preferred embodiment.

The detailed description explains the preferred embodiment of the invention, together with advantages and features, by way of example with reference to the drawing.

DETAILED DESCRIPTION OF THE INVENTION

Figure 2:
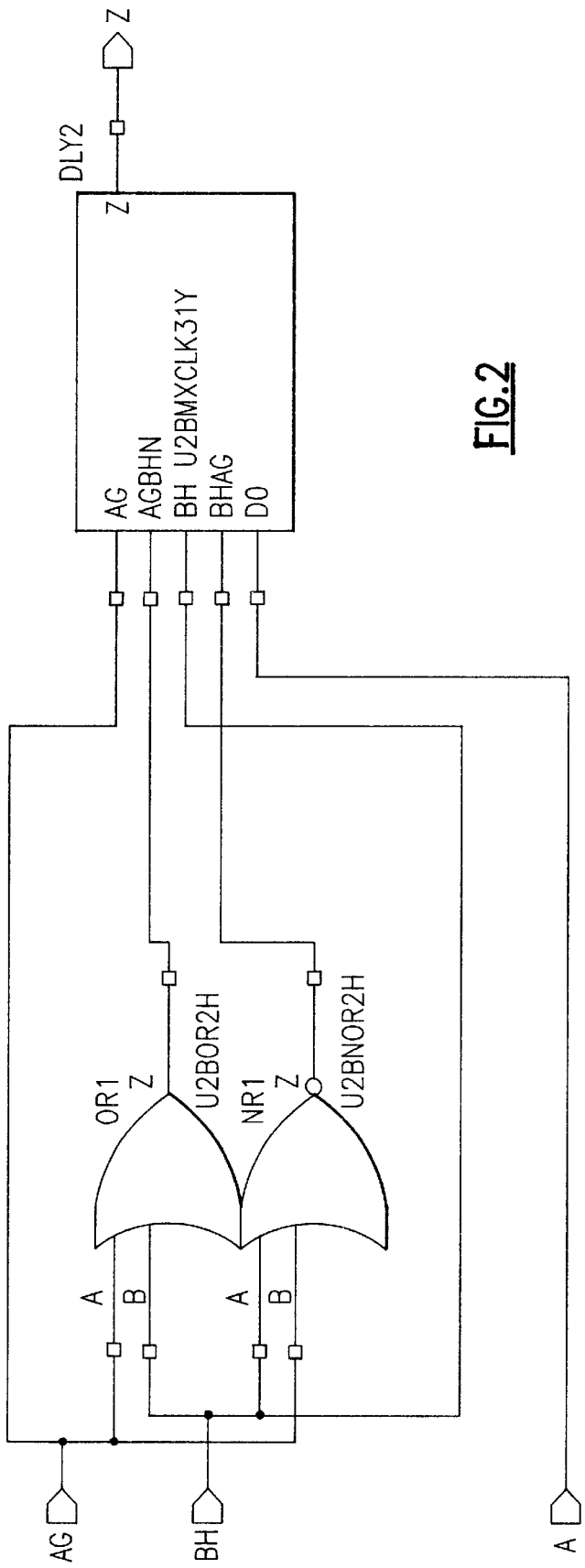
FIG. 2 illustrated the preferred embodiment of my invention.
Figure 3:
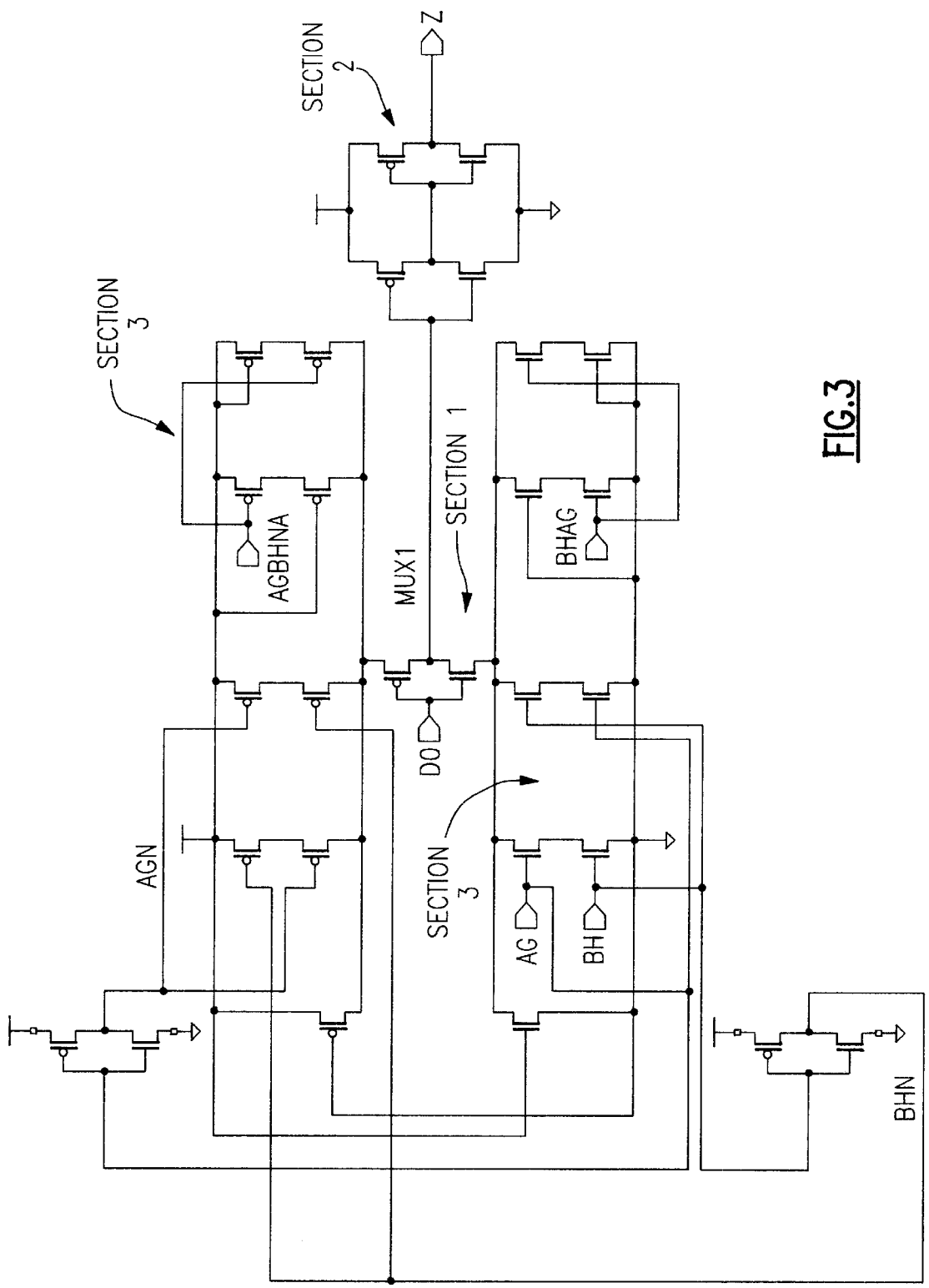
FIG. 3. Illustrates how a bi-modal delay can be implemented, one delay being constant for one set of input states, while the other can be constant for the remaining set of states.

Before describing in great detail my preferred embodiment for providing a variable delay element for jitter control for use in high speed data links it will prove useful to describe my related invention in which the circuit is used before describing FIG. 2 illustrating the preferred embodiment of my invention, and FIG. 3 which shows how a bi-modal delay can be implemented, one delay being constant for on set of input states, while the other can be constant for the remaining set of states. The multi-level dependent jitter discussed here is sometimes known as deterministic jitter.

Referring first to FIG. 1, I will describe a circuit for use in a receiver where a new method is able to be used to decrease the amount of jitter present at the receiver input of high speed data links. Jitter is the variation in pulse width of data and is caused by many components as outlined in a "jitter budget". The end result of jitter is the reduction of the data detection window, known as the "eye". As the total sum of the jitter components increases, the eye begins to collapses, eventually closing, limiting the bandwidth of the system. This preferred embodiment of the invention pre-distorts the rising and falling edge of certain data patterns to reduce jitter as compared to unacceptable other attempts not discussed in detail here which vary amplitude at the transmitter end of a high speed link or attempted to equalize the data at the receiver input.

As illustrated in FIG. 1, a logic circuit consisting of five (5) sections has a first section one (1) which provides data latches for amplitude distortion. A second section two (2) provides a pulse width pre-distortion circuit. A third section three (3) provides a muxing circuit. A forth section (4) is a clock distribution circuit and a final section five (5) provides a test circuit.

There are three primary inputs, CLOCK, DATA_1, DATA_2. There are respectively four primary outputs, A, AN, A1, AN1. There are two test inputs, BS_SI, and ACLK_DRV. And there are one test output, BS_SO. There are three control inputs, GATE1, GATE2 and GATE3. These are DC inputs only and remain unchanged.

As shown in section one (1), the primary input; DATA_1, as input to pin A of exclusive-or gate, XOR1, and positive potential VDD as input to pin B of exclusive-or gate XOR1 establish the logical Boolean expression for the inverse of DATA_1 on its output pin Z. This is also the input to pin A of exclusive-or gate XOR2 and has a positive potential of zero volts applied to pin B of exclusive-or gate XOR2 establishing the Boolean expression for the exact representation of DATA_1, whose respective outputs each applied to input data pins, D of the data latches L1 and L2. Similarly, primary input; DATA_2, as input respectively to the A pins of exclusive-or gates XOR3 and XOR4, with a positive potential, VDD as input to pin B of XOR3 and positive potential of zero volts to pin B of XOR4, respectively establishing the Boolean expression for the inverse of PDATA_2 on the output of XOR3 and establishing the Boolean expression for the exact representation of DATA_2 on the output or exclusive-or gate XOR4, where each output of the exclusive-or gates XOR3 and XOR4 respectively driving the data input pins, D of the data latches, L3 and L4. The respective outputs of data latches L1, L2, L3, L4, are launched on the rising edge of ZB; the output of clock splitter, SPLTR1. These in turn respectively drive the data inputs, D of the data latches L5, L6, L7, L9, L10.

As shown in section (2), the outputs of XOR2 and L4 respectively driving the A and B inputs of XOR5 and the outputs of L4 and L6 respectively driving the A and B inputs of XOR6. The outputs of logic gates XOR5 and XOR6 each respectively drive the data input pins, D of sampling latches L7 and L8. The output of sampleing latch, L7 is launched on the rising edge of the clock derived from pin ZB of the clock splitter; SPLTR , while the output of sampling latch L8 is launched on the rising edge of clock derived from pin ZC of clock splitter SPLTR. The outputs of latches L7 and L8 each respectively drives the input pins AG and AH of the variable delay element DLY1. The output of BUF1 drives the input pin, A of the variable delay elements, DLY1 and DLY2, while the AG and [AH] BH inputs of variable delay element DLY2 is driven by the positive supply of VDD. The output of the variable delay element, DLY1 and DLY2 each respectively drives the SD pins of MUX1, MUX2, and MUX3, MUX4. This section senses and makes a decision relative to the incoming data patterns and appropriately adjusts the rising and/or falling edge of the select signals for MUX1 and MUX2.

As shown in section Three (3), the primary inputs, DATA_1 and DATA_2 are parallel streams of data that are interleaved by the action of the data sample latches L1–L6 and L9 and L10 and mux's MUX1–MUX4. The output of latch L2 and L10, are launched by the rising edge of the ZC and ZB clocks respectively and are skewed by a half a bit time and then muxed together by MUX1. Similarly the 12 output of latch L1, and the 11 output of latch L9 are muxed together by MUX2, and the 11 output of latch L6, and the 12 output of latch L10, are muxed together at MUX3, and the 11 output of latch L5 and the 12 output of latch L9 are muxed together at MUX4, forming the inputs respectively to jtag input muxes, MUX5–MUX8, deriving output signals A, AN, A1, AN1 respectively.

As shown in section four (4), the control input signals, GATE2, GATE1 are control inputs respectively to clock splitting logic circuit SPLTR1; inputs, B and C, and control input, GATE3, as control input to clock splitting logic circuit SPLTR1; control inputs GATEB, GATEC, and primary input, CLOCK as driving forcing function to the clock splitting logic circuit SPLTR1; primary input OSC, respectively producing latch clocks ZC and ZB as respective clocks to the B and C input pins of data latches; L1, L2, L3, L4, L5, L6, L9, L10, and pattern detection latches; L7 and L8. And primary input CLOCK, as the input to pin A of logic gate BUF1, whose output, Z is the clock signal to the respective A inputs of variable delay elements, DLY1 and DLY2 whose respective outputs drive select inputs, SD, of data muxing logic circuits, MUX1, MUX2 and MUX3, MUX4 respectively.

As shown in section five (5): The test input , BS_SI, is buffered by BUF2 which drives the input pin I of data latch L1 which is enabled by the test clock ACLK_DRV. The 12 output is then serpentined to the respective datalatches, L5, L3 and L9. Also, the input test signal is sent to the I input of latch's L2, L6, L4, L10, L7 and L8 where the 12 output of latch L8 drives the input of BUF3, which in turn drives output pin BS_SO.

Now it will be noted that the preferred embodiment for the invention described above, can utilize a variable delay element for jitter control as shown in greater detail in FIGS. 2 and 3.

Turning now to the preferred embodiment of my invention illustrated by FIG. 2, which enables a method to be adopted for controlling the Jitter produced in a high speed data pre-compensation scheme. Multi-level pre-distortion is used to equalize the transmitted pulse to compensate for far end Jitter. The multilevel pre-distortion introduces an amplitude dependent component of jitter, thereby reducing the over all efficiency of the scheme. In order to adopt the methods of pre-distorting the pulse width of the data the invention allows compensation for this jitter component.

FIG. 2 shows a high level description of the invention. A clock signal is present on pin A and enters the sub-model, VDLY. Signals, BH and AG are also present and are logically OR'd and NOR'd before they enter, along with signals BH and AG, into sub model VDLY. The signals present at the inputs, BH and AG represent the current bit and the previous bit in the data stream. Thus FIG. 2, is in section 2 of FIG. 1, and is thus a circuit for generating a pre-destorted output and for compensating for level dependent jitter having an OR function element and a NOR function element each of which is coupled to two inputs and to a variable delay element as an input.

This information is then processed in the sub model, VDLY of FIG. 3. FIG. 3 illustrates how a bi-modal delay can be implemented, one delay being constant for one set of input states, while the other can be constant for the remaining set of states.

The delay is bi-modal and is determined by the states of signals BH and AG. Since there are only two inputs, there are only four states that can possibly exist. And since the delay is bi-modal, one delay is constant for one set of input states, while the other is constant for the remaining set of states. This can be seen more precisely in FIG. 3. The devices shown in section three (3) of FIG. 3 show a triple inverted path from pin D0 to pin Z. This is accomplished by PFET device P14 and NFET device N5, plus PFET devices, P70 and P64 and NFET devices N71 and N63. The delay through the latter two invert stages is independent of the input states of BH and AG. The delay through the first invert stage of section three (3) is dependent on the state of BH and AG. When the state of BH and AH are either a high level or a low level, or both are a high level, the delay is controlled by the PFET device, P66 and NFET device, N67. This is achieved by the relative physical position of the remaining devices in sections one (1) and two (2). An array structure of four common devices is constructed for each state. When NFET device N70 is turned on by input signal AG and NFET device, N145 is turned off by input signal BH, the converse arrangement of devices with the same stimulus is constructed in order to balance the effect of the static capacitance and voltage dependent capacitance on the drain of NFET device N5. This similar arrangement of devices is constructed for the other Boolean functions as shown in section one (1) and two (2) of FIG. 3. Therefore the capacitance on the drains of PFET device P14 and NFET device N5 remains constant to a second order for the three states of BH and AG being either a HIGH, LOW or a LOW, HIGH, or a HIGH, HIGH. When the states of BH and AG are a LOW, LOW, then the alternate delay is fixed by devices, P66 and N67.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A circuit for generating a pre-distorted output and for compensating for level dependent jitter, comprising:
   an OR function element (OR1) and a NOR function element (NR1) each of which is coupled to two inputs (AG and BH) and to a variable delay element (A for clock signal Z) as an input in said circuit used for generating a pre-distorted output and for compensating level dependent jitter by the variable delay of the output of said circuit.

2. A bimodal delay circuit for use in level dependent jitter compensation, comprising:
   a first section for inverting an input signal and an having an output coupled to a second section,
   a second section for buffering said output signal of said first section after it is received from said first section, and
   a third section coupled to said second section for providing a variable delay for the output of said first section, whereby a signal delay is made constant for one set of input states, while a remaining set of input states of the first section can be constant for the remaining set of states.

3. A method for decreasing the amount of jitter present at the receiver input of high speed data links which comprises the steps of:
   providing a driver circuit for input from a high speed data link which comprises a logic circuit having a first section (1) for inverting an input data signals and which provides data latches for temporary storage of said inverted data signals until launched to an output of said data signal to a second section and wherein said second section (2) has an OR function element and a NOR function element each of which is coupled to two inputs and to a variable delay element as an input, and wherein said variable delay element provides a clock time for signal delay which is made constant for one set of input states, while a remaining set of input states of is made constant for the remaining set of states to provide compensation for a pulse width pre-distortion, said second circuit being coupled to a third section (3) which provides a muxing circuit whose inputs are driven by said second section, and a fourth section (4) for clock distribution within said driver circuit of said clock time, and
   controlling jitter on the driver circuit by:
      storing in said first section (1) the data that is being sent and the last two bits history of the information being sent; and
      skewing the stored history by one half of the cycle of the bit time of said circuit; and then
      passing the data to the third section and serializing the data by passing the data through said muxing circuit; and timing information for said skewing and serialization with said clock time being provided by said fourth section; and
      after said skewing and serialization steps, the second section samples the information in the first section and adjusts the timing information with said clock time of said forth section to compensate the serialization of the third section for jitter.

4. The method according to claim 2, wherein thereafter a fifth section (5) is used for providing a logic test for the driver circuit.

* * * * *

UNITED STATES PATENT AND TRADEMARK OFFICE
CERTIFICATE OF CORRECTION

PATENT NO. : 6,404,257 B1
DATED : June 11, 2002
INVENTOR(S) : Robert R. Livolsi

It is certified that error appears in the above-identified patent and that said Letters Patent is hereby corrected as shown below:

<u>Title page,</u>
Item [57], ABSTRACT,
Line 6, change "pre-destorted" to -- pre-distorted --
Line 12 change "forth" to -- fourth --

<u>Column 1,</u>
Line 9, insert new 2nd paragraph

-- GOVERNMENT RIGHTS
This invention was made with Government support under subcontract B338307 under prime contract W-7405-ENG-48 awarded by the Department of Energy. The Government has certain rights in this invention. --
Line 66, change "have" to -- has --

<u>Column 2,</u>
Lines 1-5, delete entire paragraph
Line 16, change "illustrated" to -- illustrates --
Line 24, change "drawing" to -- drawings --
Line 36, change "on" to -- one --
Line 48, change "collapses" to -- collapse --
Line 59, change "forth" to -- fourth --
Line 65, change "are" to -- is --

<u>Column 3,</u>
Line 9, change "applied" to -- applies --
Line 30, "sampleing" to be -- sampling --
Line 38, "[AH]BH" should be -- BH --
Lines 52, 54 and 56, change "12" to -- L2 --
Lines 53, 54 and 56, change "11" to -- L1 --

UNITED STATES PATENT AND TRADEMARK OFFICE
CERTIFICATE OF CORRECTION

PATENT NO. : 6,404,257 B1
DATED : June 11, 2002
INVENTOR(S) : Robert R. Livolsi

It is certified that error appears in the above-identified patent and that said Letters Patent is hereby corrected as shown below:

Column 4,
Lines 11 and 15, change "12" to -- L2 --
Line 39 change "pre-destorted" to -- pre-distorted --

Column 6,
Line 38, change "forth" to -- fourth --

Signed and Sealed this

Twentieth Day of May, 2003

JAMES E. ROGAN
*Director of the United States Patent and Trademark Office*